(12) United States Patent
Grasshoff

(10) Patent No.: US 11,454,803 B2
(45) Date of Patent: Sep. 27, 2022

(54) MICROMECHANICAL MIRROR DEVICE

(71) Applicant: Fraunhofer-Gesellschaft zur Foerderung der angewandten Forschung e.V., Munich (DE)

(72) Inventor: Thomas Grasshoff, Dresden (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 533 days.

(21) Appl. No.: 16/598,636

(22) Filed: Oct. 10, 2019

(65) Prior Publication Data

US 2020/0049976 A1 Feb. 13, 2020

Related U.S. Application Data

(63) Continuation of application No. PCT/EP2018/025104, filed on Apr. 9, 2018.

(30) Foreign Application Priority Data

Apr. 11, 2017 (DE) ..................... 10 2017 206 252.5

(51) Int. Cl.
*G09G 5/00* (2006.01)
*G02B 26/08* (2006.01)
*G02B 7/192* (2021.01)

(52) U.S. Cl.
CPC ......... *G02B 26/0833* (2013.01); *G02B 7/192* (2013.01)

(58) Field of Classification Search
CPC ...... G02B 26/0833; G02B 7/192; G09G 5/00; G09G 5/08; G06F 3/033; G06F 3/02
See application file for complete search history.

(56) References Cited

U.S. PATENT DOCUMENTS

| 5,312,513 A | 5/1994 | Florence et al. |
| 5,543,956 A | 8/1996 | Nakagawa et al. |

(Continued)

FOREIGN PATENT DOCUMENTS

| DE | 102004037833 A1 | 3/2005 |
| DE | 102005033800 | 2/2007 |

(Continued)

*Primary Examiner* — Pegeman Karimi
(74) *Attorney, Agent, or Firm* — Perkins Coie LLP; Michael A. Glenn

(57) ABSTRACT

A micromechanical mirror device has: a plate-shaped mirror having a reflecting surface for reflecting light, the reflecting surface being configured to be planar; a closed frame structure supporting the plate-shaped mirror and completely framing an edge of the plate-shaped mirror; a spring arrangement having at least two spring structures arranged mirror-symmetrically and connecting the closed frame structure to a stationary support structure, the spring arrangement being configured such that the closed frame structure and the plate-shaped mirror can be brought into a resonant vibrational state with respect to the support structure; and a connecting arrangement having at least four connecting spring structures arranged mirror-symmetrically and each connecting the plate-shaped mirror to the closed frame structure; the connecting spring structures being configured to be elastically deformable and arranged such that they deform back and forth in the resonant vibrational state so that the plate-shaped mirror is partially mechanically decoupled from the closed frame structure.

23 Claims, 8 Drawing Sheets

(56) References Cited

U.S. PATENT DOCUMENTS

| | | | |
|---|---|---|---|
| 5,739,941 | A | 4/1998 | Knipe et al. |
| 6,749,308 | B1 | 6/2004 | Niendorf et al. |
| 6,781,731 | B2 | 8/2004 | Choi |
| 7,256,919 | B1 | 8/2007 | Jeong et al. |
| 7,301,692 | B2 | 11/2007 | Ko et al. |
| 7,369,288 | B2 | 5/2008 | Wolter et al. |
| 8,345,336 | B2 | 1/2013 | Krastev et al. |
| 8,873,128 | B2 | 10/2014 | Conrad et al. |
| 9,467,034 | B2 | 10/2016 | Gamet et al. |
| 10,877,263 | B2 * | 12/2020 | Van Lierop ........ G02B 26/0841 |
| 2002/0012180 | A1 * | 1/2002 | Yu ...................... G02B 26/0841 |
| | | | 359/872 |
| 2002/0041455 | A1 | 4/2002 | Sawada et al. |
| 2002/0064192 | A1 | 5/2002 | Missey et al. |
| 2002/0131682 | A1 | 9/2002 | Nasiri et al. |
| 2003/0007262 | A1 | 1/2003 | Tsuboi et al. |
| 2003/0203530 | A1 | 10/2003 | Lee et al. |
| 2005/0134951 | A1 | 6/2005 | Mi et al. |
| 2006/0144948 | A1 | 7/2006 | Fu |
| 2007/0047046 | A1 | 3/2007 | Ji |
| 2011/0261431 | A1 * | 10/2011 | Conrad ................ B81B 3/0048 |
| | | | 359/290 |
| 2013/0250390 | A1 | 9/2013 | Tani |
| 2014/0028152 | A1 * | 1/2014 | Lai ....................... B81B 3/0045 |
| | | | 310/321 |
| 2016/0299335 | A1 * | 10/2016 | Hofmann ............. G02B 26/101 |

FOREIGN PATENT DOCUMENTS

| | | |
|---|---|---|
| DE | 102010028111 A1 | 10/2011 |
| DE | 102013223933 A1 | 5/2015 |
| EP | 1757972 A1 | 2/2007 |
| WO | 2015075222 A1 | 5/2015 |

* cited by examiner

MICROMECHANICAL MIRROR DEVICE

CROSS-REFERENCE TO RELATED APPLICATIONS

This application is a continuation of copending International Application No. PCT/EP2018/025104, filed Apr. 9, 2018, which is incorporated herein by reference in its entirety, and additionally claims priority from German Application No. 10 2017 206 252.5, filed Apr. 11, 2017, which is also incorporated herein by reference in its entirety.

BACKGROUND OF THE INVENTION

The invention relates to a micromechanical mirror device which comprises a plate-shaped mirror having a reflecting surface for reflecting light, which can be brought into a resonant vibrational state by means of electrical forces so that incident light can be reflected in dependence on the respective back and forth or reciprocating deflection of the plate-shaped mirror. Such micromechanical mirror devices are also called MEMS scanner mirrors.

Micromechanical mirror devices of the type described here are frequently used in optical applications having deflection units for light beams where deflections with comparatively great frequencies and/or large apertures or reflection surfaces are used. The problem here is that the usual dimensioning of the plate-shaped mirrors during operation leads to deformations of the plate-shaped mirrors, which can range from the nanometer to the micrometer ranges, depending on the selected frequency, aperture and deflection. These deformations in turn lead to an undesired influence on the reflection behavior of the respective plate-shaped mirrors. During operation, the deformations of the plate-shaped mirrors can exceed an application-specific value, which either restricts the field of application or means that the application itself is no longer feasible.

Documents [1] to [7] each describe different known micromechanical mirror devices.

SUMMARY

According to an embodiment, a micromechanical mirror device may have:

a plate-shaped mirror having a reflecting surface for reflecting light, the reflecting surface being configured to be planar in a rest state and aligned in parallel to an xy plane of a coordinate system having an x-axis, a y-axis and a z-axis, wherein, in the rest state, a center of gravity of the plate-shaped mirror is located in an origin of the coordinate system;

a closed frame structure which supports the plate-shaped mirror and which, in the rest state, completely frames an edge of the plate-shaped mirror as seen from the direction of the z-axis;

a spring arrangement having at least two spring structures which, in the rest state, are arranged mirror-symmetrically with respect to an xz plane of the coordinate system and a yz plane of the coordinate system and which connect the closed frame structure to a supporting structure which is stationary in the coordinate system, the spring arrangement being configured such that the closed frame structure and the plate-shaped mirror can be brought into a resonant vibrational state relative to the supporting structure by means of electrostatic, electromagnetic or piezoelectric forces; and a connecting arrangement having at least four connecting spring structures which, in the rest state, are arranged mirror-symmetrically with respect to the xz plane and the yz plane and which each connect the plate-shaped mirror to the closed frame structure; the connecting spring structures being configured to be elastically deformable and arranged in such a way that they deform back and forth in the resonant vibrational state so that the plate-shaped mirror is partially mechanically decoupled from the closed frame structure.

The term "plate-shaped" refers to the basic shape of the mirror, which is such that the mirror has a considerably smaller thickness compared to a length and a width. The mirror or its reflecting surface can be elliptical, especially round, or polygonal, especially rectangular or square. The reflection surface can be adapted to the type of incident light in such a way that a high reflectance is achieved. In principle, the light may come from any light source, but especially from a laser.

The rest state is the state that the micromechanical mirror device assumes when the plate-shaped mirror and the closed frame structure are not deflected by electrical forces.

The term "closed" here refers to the basic shape of the frame structure which is such that it is formed as a ring so that forces introduced in the frame at any point can be distributed along the ring on both sides. The term "framed completely" refers to the fact that the frame structure completely surrounds the mirror without interruption.

The spring structures are configured in such a way that they push the closed frame structure and the mirror arranged on it, when they are deflected from their rest position, back into their rest position by means of spring forces. The stationary support structure can have several portions, each of the spring structures being attached to at least one of the portions of the support structure.

The excitation of the resonant vibrational state can take place with known electric drives which generate electrostatic, electromagnetic or piezoelectric forces which act periodically on the closed frame and/or on the plate-shaped mirror.

The connecting spring structures form the connection between the plate-shaped mirror and the closed frame structure. The connection is elastic so that the connecting spring structures are periodically deformed in the resonant vibrational state, so that the plate-shaped mirror is partially mechanically decoupled from the closed frame structure. The latter means that a relative movement of a region of the mirror adjacent to one of the connecting structures relative to a region of the frame structure adjacent to the respective connecting structure is possible if the mirror device is in the resonant vibrational state. In particular, the connecting spring structures can be configured to be elastically deformable and arranged in such a way that the plate-shaped mirror is at least partially decoupled from a dynamic deformation of the closed frame structure occurring in the resonant vibrational state.

The plate-shaped mirror, the closed frame structure, the spring arrangement and the connecting arrangement can each, or as a whole, be implemented in one piece. However, the plate-shaped mirror, the closed frame structure, the spring arrangement and the connecting arrangement can also be produced each or as a whole by producing several individual parts which are then joined together, for example integrally. The extensions in the z-direction, i.e. the heights of, the plate-shaped mirror, the closed frame structure of the spring arrangement and the connecting arrangement can be uniform or different at the level of the components mentioned or at the level of the entirety of the components mentioned.

The deformation of a finitely rigid plate-shaped mirror in the resonant vibrational state is called dynamic deformation and is the greatest in the point of reversal of the vibration. It is generally composed of a "spring-dependent" deformation, which is caused by the action of spring forces and/or spring moments of the spring arrangement on the plate-shaped mirror, and a "plate-dependent" deformation, which is caused by inertial forces and/or moments of inertia.

The "spring-dependent" deformation cannot be neglected, especially with high resonant frequencies and large mirrors, since the rigidity of the spring arrangement increases and the achievable rigidity of the plate-shaped mirror decreases simultaneously with an increasing resonant frequency and increasing size of the mirror.

The inventive combination having the closed frame structure, the spring arrangement with at least two spring structures and the connecting arrangement with at least four connecting spring structures means that the spring forces and/or spring moments of the spring arrangement do not act directly on the plate-shaped mirror. Rather, the spring forces and/or spring moments of the spring arrangement are first transferred to the closed frame structure. From there, they are transmitted to the plate-shaped mirror as coupling forces and/or coupling moments distributed over at least four connecting spring structures, the plate-shaped mirror being partially mechanically decoupled from the closed frame structure by the elasticity of the connecting spring structures.

Practical tests and model calculations have shown that the maximum dynamic deformation of the plate-shaped mirror of the micromechanical mirror device in accordance with the invention is significantly lower than in conventional micromechanical mirror devices in which the spring forces and/or spring moments of the spring arrangement act directly on the plate-shaped mirror, i.e. without positioning a frame structure therebetween. Further practical tests and model calculations have shown that the maximum dynamic deformation of the plate-shaped mirror of the inventive micromechanical mirror device is also significantly lower than in micromechanical mirror devices with an open frame structure. Further practical tests and model calculations have shown that the maximum dynamic deformation of the plate-shaped mirror of the inventive micromechanical mirror device is significantly lower than in micromechanical mirror devices which have a rigid, i.e. non-elastic, connection between the plate-shaped mirror and the frame structure. The latter is probably due to the fact that the elasticity of the connecting spring structures prevents dynamic deformation of the frame structure, which can never be completely excluded due to the finite rigidity of the frame structure, from contributing to a dynamic deformation of the plate-shaped mirror.

All in all, the invention causes the maximum dynamic deformation of the plate-shaped mirror to be reduced compared to other solutions—at a given reflection surface of the mirror and at a given resonance frequency—since the combination of features according to the invention causes the "plate-dependent" deformation and the "spring-dependent" deformation to at least partially compensate each other. Conversely, the invention causes the reflection surface and/or the resonance frequency to be increased—for a given deformation.

According to an advantageous further development of the invention, at least two connecting spring structures of the connecting spring structures are arranged and configured to be elastically deformable in such a way that, as seen from the direction of the z-axis, in the resonant vibrational state, they torsion or twist back and forth about a torsion axis extending transversely to the edge of the plate-shaped mirror. In this way, the transmission of coupling moments from the closed frame structure to the plate-shaped mirror generated by a dynamic deformation of the closed frame structure can be prevented or at least reduced, so that the dynamic deformation of the plate-shaped mirror in the resonant vibrational state can be reduced. In this embodiment, the respective connecting spring structure assumes the function of a torsion spring.

In accordance with an advantageous further development of the invention, at least two connecting spring structures of the connecting spring structures are arranged and configured to be elastically deformable in such a way that, in the resonant vibrational state, a back and forth or reciprocating offset occurs between the closed frame structure and the plate-shaped mirror at the respective connecting spring structure in a direction of offset extending in parallel to the z-axis. In this way, the transmission of coupling forces from the closed frame structure to the plate-shaped mirror generated by a dynamic deformation of the closed frame structure can be prevented or at least reduced, so that the dynamic deformation of the plate-shaped mirror can be reduced in the resonant vibrational state. In this embodiment, the respective connecting spring structure assumes the function of a bending spring.

Of course, the at least two connecting spring structures can also be configured in such a way that they simultaneously torsion back and forth in the resonant vibrational state and enable a back and forth offset. In this embodiment, the respective connecting spring structure assumes both the function of a bending spring and the function of a torsion spring.

In accordance with an appropriate further development of the invention, at least two of the connecting spring structures are separated from the closed frame structure by a first opening on their side facing away from the origin. The first opening can be a recess through the closed frame structure in the z-direction. Seen in the xy plane, the first opening can be oblong and extend along the edge of the plate-shaped mirror. The first opening can serve to reduce the mechanical coupling of the respective connecting spring structure and the closed frame structure, so that the desired elasticity of the connection between the closed frame structure and the plate-shaped mirror, i.e. the desired elasticity of the connecting spring structures, is achieved, thus reducing the dynamic deformation of the plate-shaped mirror.

In accordance with an appropriate further development of the invention, at least two of the connecting spring structures are separated from the plate-shaped mirror by a second opening on their side facing the origin. The second opening may in particular be a recess through the closed frame structure as seen in the z-direction. Seen in the xy plane, the second opening can be oblong and extend along the edge of the plate-shaped mirror. The second opening can serve to reduce the mechanical coupling of the respective connecting spring structure and the plate-shaped mirror, so that the desired elasticity of the connection between the closed frame structure and the plate-shaped mirror, i.e. the desired elasticity of the connecting spring structures, is achieved, thus reducing the dynamic deformation of the plate-shaped mirror.

Embodiments are possible in which the at least two connecting spring structures are each associated a first opening and a second opening.

In accordance with an appropriate further development of the invention, at least two of the connecting spring structures, as seen from the direction of the z-axis, are T-shaped in such a way that they each have three beam spring portions each having a first end region and a second end region, wherein the three beam spring portions are connected to one another at the first end regions, wherein a first beam spring portion of the beam spring portions extends transversely to the edge of the plate-shaped mirror. Such T-shaped connecting spring structures can assume both the function of a bending spring and the function of a torsion spring. Seen in the xy plane, they consume only a small area.

According to an advantageous further development of the invention, the first beam spring portion is connected to the plate-shaped mirror at the second end region, wherein a second beam spring portion and a third beam spring portion of the beam spring portions each extend along the edge of the plate-shaped mirror and are each connected to the closed frame structure at the second end region. Since the second beam spring portion and the third beam spring portion are arranged on the side of the respective connecting spring structure facing away from the plate-shaped mirror, the size of the reflecting surface is not affected by this.

According to an advantageous further development of the invention, the second beam spring portions and the third beam spring portions of the T-shaped connecting spring structures, which each extend along the edge of the plate-shaped mirror, are separated from the closed frame structure by a first opening on their side facing away from the origin. Since the first opening is provided on the side of the connecting spring structure facing away from the origin, i.e. also on the side of the connecting spring structure facing away from the plate-shaped mirror, the size of the reflecting surface is not affected by this.

In accordance with an appropriate further development of the invention, the first beam spring portion is connected to the closed frame structure at the second end region, wherein a second beam spring portion and a third beam spring portion of the beam spring portions each extend along the edge of the plate-shaped mirror and are each connected to the plate-shaped mirror at the second end region. Such T-shaped connecting spring structures can also assume the function of both a bending spring and a torsion spring.

In accordance with an advantageous further development of the invention, the second beam spring portions and third beam spring portions of the T-shaped connecting spring structures, which each extend along the edge of the plate-shaped mirror, are separated from the plate-shaped mirror by a second opening on their side facing the origin.

All in all, it became clear that T-shaped connecting spring structures have a positive effect on the dynamic deformation of the plate-shaped mirror.

In accordance with an advantageous further development of the invention, at least two of the connecting spring structures are H-shaped, seen from the direction of the z-axis, in such a way that they each have five beam spring portions each with a first end region and a second end region, a first beam spring portion of the beam spring portions extending transversely to the edge of the plate-shaped mirror, the first end region of the first beam spring portion being connected to the first end regions of a second beam spring portion and a third beam spring portion of the beam spring portions which each extent along the edge of the plate-shaped mirror, and the second end region of the first beam spring portion are connected to the closed frame structure at the second end region, and wherein the second end region of the first beam spring portion is connected to the first end regions of a fourth beam spring portion and a fifth beam spring portion of the beam spring portions which extend along the edge of the plate-shaped mirror and are each connected to the plate-shaped mirror at the second end region.

In accordance with an appropriate further development of the invention, the second beam spring portion and the third beam spring portion of the H-shaped connecting spring structures, each extending along the edge of the plate-shaped mirror and each to the closed frame structure connected at the second end region, are separated from the closed frame structure by a first opening on their side facing away from the origin.

In accordance with an advantageous further development of the invention, the fourth beam spring portion and the fifth beam spring portion of the H-shaped connecting spring structures, which each extend along the edge of the plate-shaped mirror and are each connected to the plate-shaped mirror at the second end region, are separated from the plate-shaped mirror by an opening on their side facing the origin.

The H-shaped connecting spring structures are such connecting spring structures which combine two of the T-shaped connecting spring structures described above. Such H-shaped connecting spring structures can assume the function of both a bending spring and a torsion spring. It has shown that such connecting spring structures have a favorable effect on the dynamic deformation of the plate-shaped mirror.

According to an advantageous further development of the invention, the spring arrangement comprises exactly two spring structures, which are configured and arranged in such a way that the closed frame structure and the plate-shaped mirror can be deflected rotatably about the x-axis. A plate-shaped mirror mounted in this way is also referred to as an adjustable or tilting mirror. Rotatably mounted mirrors can be used, for example, in projection displays, e.g. retina scanning displays, in pattern and image readers, e.g. barcode readers, in measuring devices, in laser printers or in direct imagers.

According to a further development of the invention, the connecting arrangement comprises a first connecting spring structure group containing a part of the connecting spring structures and a second connecting spring structure group containing another part of the connecting spring structures, wherein the connecting spring structures of the first connecting spring structure group have a first elastic deformability, wherein the connecting spring structures of the second connecting spring structure group have a second elastic deformability, and wherein the first elastic deformability and the second elastic deformability differ. Such a design is particularly advantageous for rotatably mounted mirrors. In this case, the first connecting spring structure group can be optimized with respect to those forces and moments to be transmitted to or adjacent to the axis of rotation, while the second connecting spring structure group can be optimized with respect to those forces and moments to be transmitted remote from the axis of rotation. In this way, the dynamic deformation of the plate-shaped mirror can be further reduced.

In accordance with an appropriate further development of the invention, the first connecting spring structure group contains two connecting spring structures of the connecting spring structures which, in the rest state, are arranged along the x-axis and arranged mirror-symmetrically with respect to the yz plane.

According to an appropriate further development of the invention, the first connecting spring structure group contains four connecting spring structures of the connecting spring structures which, in the rest state, are arranged adjacent to the x-axis and are arranged mirror-symmetrically with respect to the xz plane and the yz plane.

In accordance with an appropriate further development of the invention, the second connecting spring structure group contains two connecting spring structures of the connecting spring structures which, in the rest state, are arranged along the y-axis and are arranged mirror-symmetrically with respect to the yz plane.

According to an appropriate further development of the invention, the second connecting spring structure group contains four connecting spring structures of the connecting spring structures which, in the rest state, are arranged adjacent to the y-axis and are arranged mirror-symmetrically with respect to the xz plane and the yz plane.

All in all, it has shown that embodiments having a first connecting spring structure group and a second connecting spring structure group lead to a slight dynamic deformation of the plate-shaped mirror.

According to a further development of the invention, the spring arrangement comprises at least two spring structures which are configured and arranged in such a way that the closed frame structure and the plate-shaped mirror can be deflected translationally in the direction of the z-axis. A mirror mounted in this way is also referred to as a pump mirror. Pump mirrors are used, for example, in spectroscopy as Fourier transform spectrometers.

According to a further development of the invention, the connecting arrangement comprises at least four connecting spring structures which exhibit the same elastic deformability. In this way, a mirror moving back and forth translationally can be securely supported so that the dynamic shaping of the plate-shaped mirror is influenced favorably.

According to an appropriate further development of the invention, a number of the spring structures corresponds to a number of connecting spring structures, wherein the spring structures and the connecting spring structures are arranged alternately along the edge. In this way, the dynamic deformation of the plate-shaped mirror can be reduced further.

In accordance with an appropriate further development of the invention, a distance between the closed frame structure and the plate-shaped mirror is constant along the edge of the plate-shaped mirror, seen from the direction of the z-axis, at least outside regions of the connecting spring structures. In this way, a particularly compact design can be achieved. In addition, such a design has a positive effect on the dynamic deformation of the plate-shaped mirror.

BRIEF DESCRIPTION OF THE DRAWINGS

Embodiments of the present invention and its advantages will be described in more detail below referring to the Figures, in which.

DETAILED DESCRIPTION OF THE INVENTION

In the following Figures, identical or similar elements or elements with identical or equivalent functions are provided with identical or similar reference signs.

In the following description, embodiments having a multitude of features of the present invention are described in more detail in order to convey a better understanding of the invention. However, it should be noted that the present invention can also be implemented by omitting some of the features described. It should also be noted that the features shown in various examples can also be combined in other ways, unless this is expressly excluded or would lead to contradictions.

Figure 1:
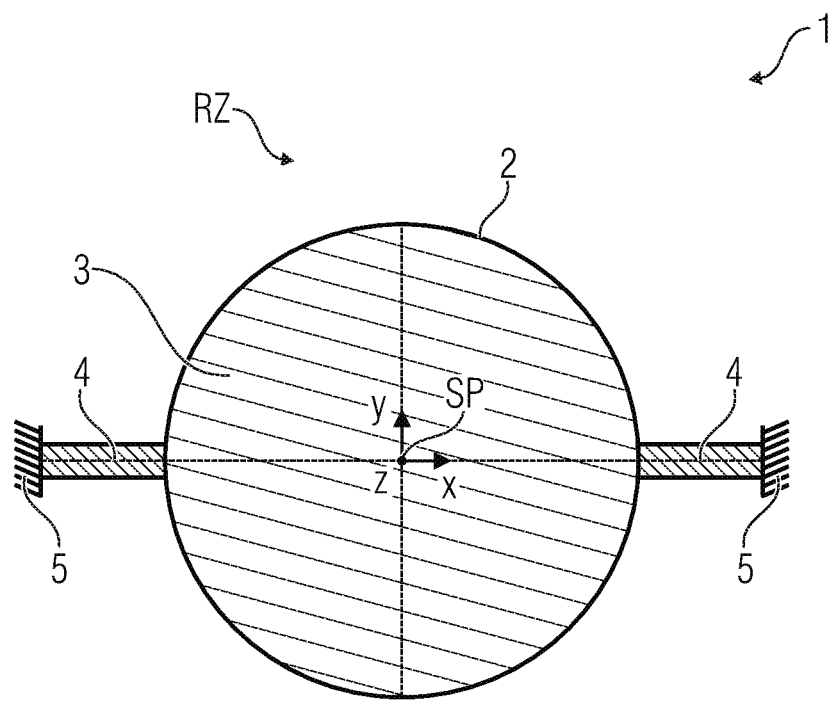
FIG. 1 shows a known micromechanical mirror device in the rest state in a schematic supervision.

FIG. 1 shows a known micromechanical mirror device 1 in a schematic top view. The micromechanical mirror device 1 comprises a plate-shaped mirror 2 having a reflecting surface 3 for reflecting light, which is rotatably fixed to a stationary supporting structure 5 by means of two springs 4. The plate-shaped mirror 2 is shown in its rest state RZ.

Figure 2:
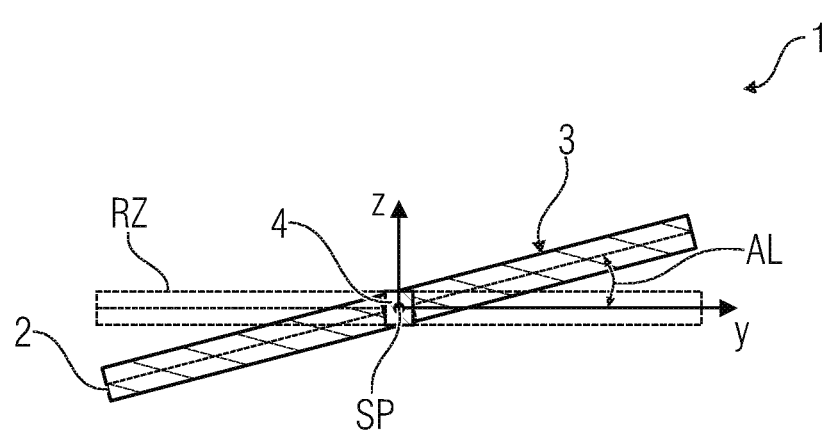
FIG. 2 shows the known micromechanical mirror device in the point of reversal in a schematic side view.

FIG. 2 shows the known micromechanical mirror device 1 in a schematic side view. The plate-shaped mirror 2 is deflected from the rest state RZ by a deflection AL.

Figure 3:
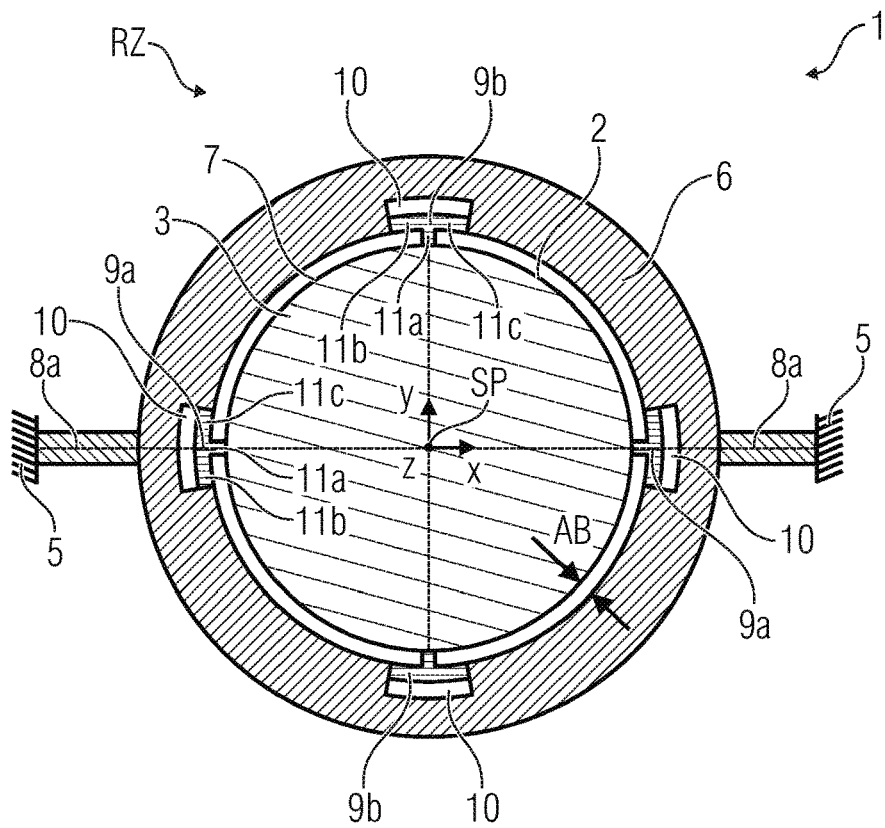
FIG. 3 shows a first embodiment of an inventive micromechanical mirror device in the rest state in a schematic top view.

FIG. 3 shows a first embodiment of an inventive micromechanical mirror device 1 in a schematic top view. The micromechanical mirror device 2 comprises:

a plate-shaped mirror 2 having a reflection surface 3 for reflecting light, wherein the reflection surface 3 is configured to be planar in a rest state RZ and is aligned in parallel to an xy plane of a rectangular coordinate system having an x-axis, a y-axis and a z-axis, wherein, in the rest state RZ, a center of gravity SP of the plate-shaped mirror 2 is located in an origin of the coordinate system;

a closed frame structure 6 which supports the plate-shaped mirror 2 and which, in the rest state RZ, completely frames an edge 7 of the plate-shaped mirror 2 as seen from the direction of the z axis;

a spring arrangement having at least two spring structures 8 which, in the rest state RZ, are arranged mirror-symmetrically with respect to an xz plane of the coordinate system and a yz plane of the coordinate system and which connect the closed frame structure 6 to a supporting structure 5 which is stationary in the coordinate system, the spring arrangement being configured such that the closed frame structure 6 and the plate-shaped mirror 2 can be brought into a resonant vibrational state relative to the supporting structure 5 by means of electrostatic, electromagnetic or piezoelectric forces; and a connecting arrangement having at least four connecting spring structures 9 which, in the rest state, are arranged mirror-symmetrically with respect to the xz plane and the yz plane and which each connect the plate-shaped mirror 2 to the closed frame structure 6; wherein the connecting spring structures 9 are configured to be elastically deformable and arranged in such a way that they deform back and forth in the resonant vibrational state so that the plate-shaped mirror 2 is partially mechanically decoupled from the closed frame structure 6.

The plate-shaped mirror 2 and the closed frame structure 6 are shown in the rest state RZ.

In accordance with a further development of the invention, at least two connecting spring structures 9a of the connecting spring structures 9 are arranged and configured to be elastically deformable in such a way that, in the resonant vibrational state, they torsion or twist back and forth about a torsion axis extending transversely to the edge 7 of the plate-shaped mirror 2 as seen from the direction of the z-axis. The two connecting spring structures 9a are arranged opposite each other on the x-axis and perform exclusively the function of a torsion spring.

In accordance with a further development of the invention, at least two connecting spring structures 9b of the connecting spring structures 9 are arranged and configured to be elastically deformable in such a way that, in the resonant vibrational state, a back and forth offset occurs between the closed frame structure 6 and the plate-shaped mirror 2 at the respective connecting spring structure 9b in a direction of offset extending in parallel to the z-axis. The two connecting spring structures 9b are arranged opposite each other on the y-axis and perform exclusively the function of a bending spring.

In accordance with an appropriate further development of the invention, at least two of the connecting spring structures 9 are separated from the closed frame structure by a first opening 10 on their side facing away from the origin.

In accordance with an appropriate further development of the invention, at least two of the connecting spring structures 9, as seen from the direction of the z-axis, are configured to be T-shaped in such a way that they each have three beam spring portions 11, each having a first end region and a second end region, the three beam spring portions 11 being connected to one another at the first end regions, a first beam spring portion 11a of the beam spring portions 11 extending transversely to the edge 7 of the plate-shaped mirror 2.

In accordance with an appropriate further development of the invention, the first beam spring portion 11a is connected to the plate-shaped mirror 2 at the second end region, wherein a second beam spring portion 11b and a third beam spring portion 11c of the beam spring portions 11 each extend along the edge 7 of the plate-shaped mirror 2 and are each connected to the closed frame structure 6 at the second end region.

In accordance with an appropriate further development of the invention, the second beam spring portions 11b and the third beam spring portions 11c of the T-shaped connecting spring structures 9, which each extend along the edge 7 of the plate-shaped mirror 2, are separated from the closed frame structure 10 by a first opening 10 on their side facing away from the origin.

In accordance with a functional further development of the invention which is not shown, the first beam spring portion 11a is connected to the closed frame structure 6 at the second end region, wherein a second beam spring portion 11b and a third beam spring portion 11c of the beam spring portions 11 each extend along the edge 7 of the plate-shaped mirror 2 and are each connected to the plate-shaped mirror 2 at the second end region.

In accordance with a functional further development of the invention which is not shown, the second beam spring portions 11b and third beam spring portions 11c of the T-shaped connecting spring structures 9, which each extend along the edge 7 of the plate-shaped mirror 2, are separated from the plate-shaped mirror by a second opening 122 on their side facing the origin.

In accordance with an advantageous further development of the invention, the spring arrangement comprises exactly two spring structures 8a, which are configured and arranged in such a way that the closed frame structure 6 and the plate-shaped mirror 2 can be deflected rotatably about the x-axis. The spring arrangement can comprise two spring structures 8a opposite each other on the x-axis, which are configured as torsion spring structures, so that the plate-shaped mirror 2 and the closed frame structure 6 can be brought into a rotatable resonant vibrational state by means of electrical forces.

In accordance with an appropriate further development of the invention, the connecting arrangement comprises a first connecting spring structure group, which contains a part of the connecting spring structures 9, and a second connecting spring structure group, which contains another part of the connecting spring structures 9, wherein the connecting spring structures 9a of the first connecting spring structure group have a first elastic deformability, wherein the connecting spring structures 9b of the second connecting spring structure group have a second elastic deformability, the first elastic deformability and the second elastic deformability differing.

In accordance with an advantageous further development of the invention, the first connecting spring structure group contains two connecting spring structures 9a of the connecting spring structures 9, which, in the rest state RZ, are arranged along the x-axis and are arranged mirror-symmetrically with respect to the yz-plane.

In accordance with an appropriate further development of the invention, the second connecting spring structure group contains two connecting spring structures 9b of the connecting spring structures 9 which, in the rest state RZ, are arranged along the y-axis and are arranged mirror-symmetrically with respect to the yz-plane.

According to an appropriate further development of the invention, a distance AB between the closed frame structure 6 and the plate-shaped mirror 2 is constant along the edge 7 of the plate-shaped mirror 2 as seen from the direction of the z-axis, at least outside regions of the connecting spring structures 9.

The two connecting spring structures 9a can exhibit the same elasticity. The two connecting spring structures 9b can also have the same elasticity.

In the inventive embodiment according to FIG. 3, an elliptical mirror plate 2 which can be deflected rotatably about the x-axis (or translationally in the z-direction) is connected to the ring-shaped frame structure 6 by means of two connecting spring structures 9a and two connecting spring structures 9b. The connecting spring structures 9a and 9b can have different geometric parameters or overall rigidities in the case of a rotatable design. The connecting spring structures 9b are arranged in the y-axis perpendicular to the axis of rotation. The connecting spring structures 9a in contrast extend in the x-axis or axis of rotation of the plate-shaped mirror 2. The four connecting spring structures 9 in total are T-shaped here by the defined openings 10 in such a way that three beam spring portions 11a, 11b, 11c are formed per connecting spring structure 9, two beam spring portions 11b, 11c being arranged in parallel and one beam spring portion perpendicular to the inner ring circumference line 7. The vertical beam spring portion 11a here is connected to the mirror plate 2. The beam spring portions 11 have defined torsion and bending rigidities. The closed ring-shaped frame structure 6 is connected to the anchor 5 via the spring structures 8a located in the axis of rotation and the plate-shaped mirror 2 is thus firmly mounted.

Figure 4:
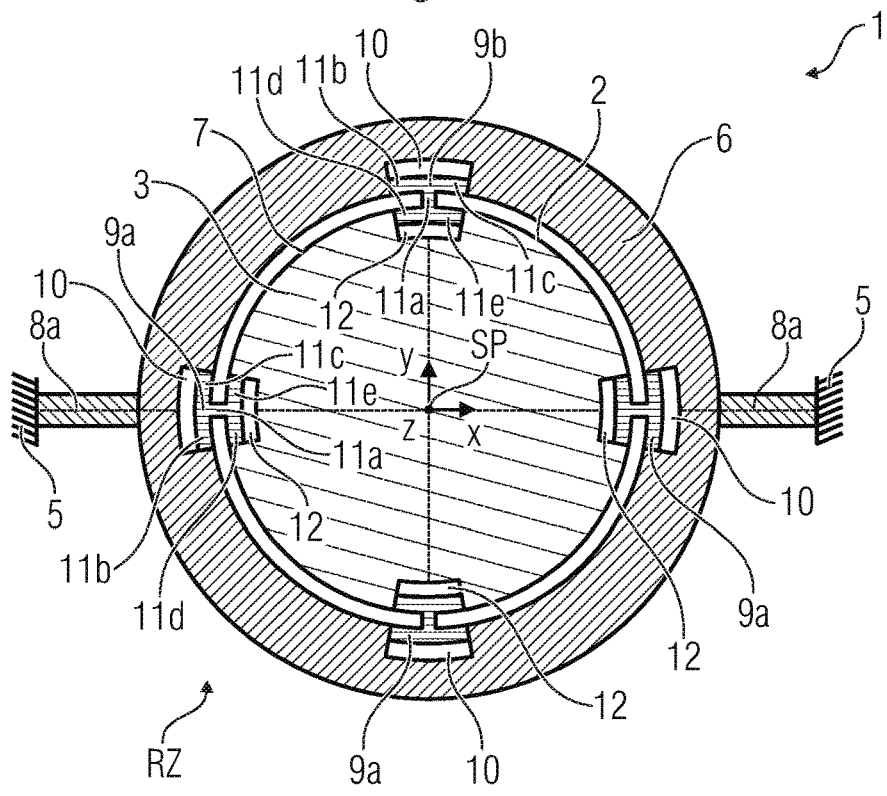
FIG. 4 shows a second embodiment of an inventive micromechanical mirror device in the rest state in a schematic top view.

FIG. 4 shows a second embodiment of an inventive micro-mechanical mirror device 1 in a schematic top view. The second embodiment is based on the first embodiment, so that only the differences are explained below.

In accordance with an appropriate further development of the invention, at least two of the connecting spring structures 9 are separated from the plate-shaped mirror 2 by a second opening 12 on their side facing the origin.

In accordance with an appropriate further development of the invention, at least two of the connecting spring structures 9, as seen from the direction of the z-axis, are H-shaped in such a way that they each have five beam spring portions 11, each having a first end region and a second end region, wherein a first beam spring portion 11a of the beam spring portions 11 extends transversely to the edge 7 of the plate-shaped mirror 2, wherein the first end region of the first beam spring portion 11a is connected to the first end regions of a second beam spring portion 11b and a third beam spring portion 11c of the beam spring portions 11, which each extend along the edge 7 of the plate-shaped mirror 2 and are each connected to the closed frame structure 6 at the second end region, and wherein the second end region of the first beam spring portion 11a is connected to the first end regions of a fourth beam spring portion 11d and a fifth beam spring portion 11e of the beam spring portions 11, which extend along the edge 7 of the plate-shaped mirror 2 and are each connected to the plate-shaped mirror 2 at the second end region.

In accordance with an appropriate further development of the invention, the second beam spring portion 11b and the third beam spring portion 11c of the H-shaped connecting spring structures 9, which each extend along the edge 7 of the plate-shaped mirror 2 and are each connected to the closed frame structure 6 at the second end region, are separated from the closed frame structure 6 by a first opening 10 on their side facing away from the origin.

In accordance with an appropriate further development of the invention, the fourth beam spring portion 11d and the fifth beam spring portion 11e of the H-shaped connecting spring structures 9, which each extend along the edge 7 of the plate-shaped mirror 2 and are each connected to the plate-shaped mirror 2 at the second end region, are separated from the plate-shaped mirror 2 by a second opening 12 on their side facing the origin.

In the inventive embodiment according to FIG. 4, an elliptical mirror plate 2 which can be deflected rotatably about the x-axis (or translationally in the z-direction) is connected to the ring-shaped frame structure 6 by means of two connecting spring structures 9a and two connecting spring structures 9b. The connecting spring structures 9a and 9b can have different geometric parameters or overall rigidities in the case of a rotatable design. The connecting spring structures 9b are arranged in the y-axis perpendicular to the axis of rotation. The connecting spring structures 9a in contrast extend in the x-axis or axis of rotation of the plate-shaped mirror 2. The four connecting spring structures 9 in total are formed here by the defined openings 10 and 12 in such a way that five beam spring portions 11a, 11b, 11c, 11d, 11e are produced per connecting spring structure 9, four beam spring portions 11b, 11c, 11d, 11e being arranged in parallel and one connecting beam spring portion 11a perpendicular to the inner annular circumference line 7. The beam spring portions 11 exhibit defined torsional and bending rigidities. The closed ring-shaped frame structure 6 is connected to the anchor 5 via the spring structures 8a located in the axis of rotation and the plate-shaped mirror 2 is thus firmly mounted.

Figure 5:
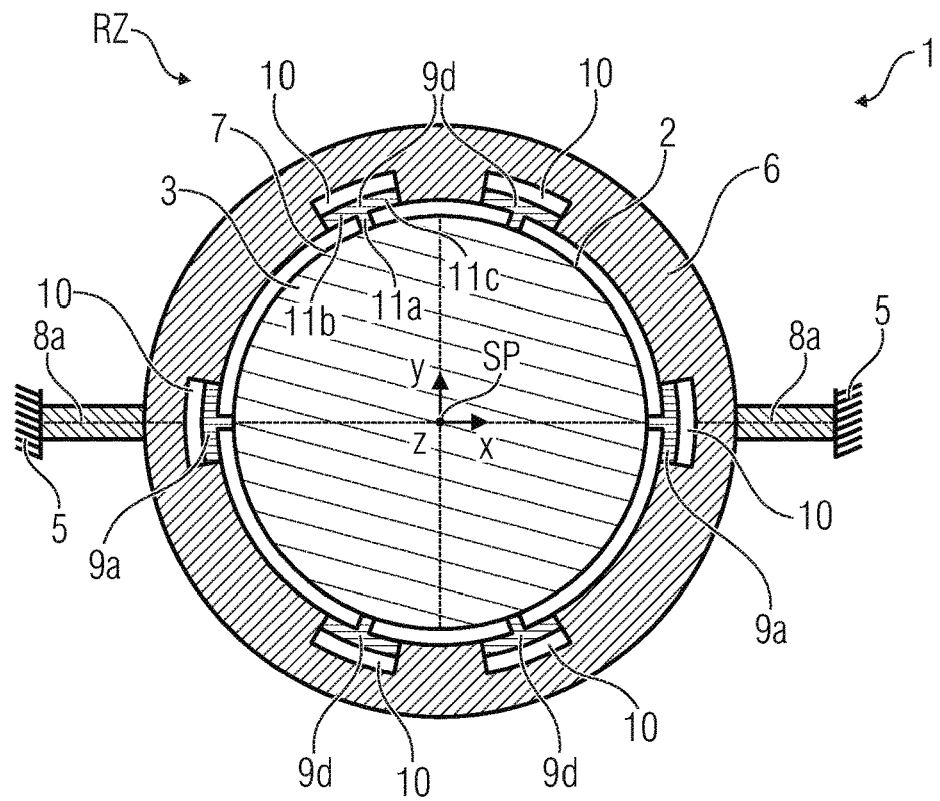
FIG. 5 shows a third embodiment of an inventive micromechanical mirror device in the rest state in a schematic top view.

FIG. 5 shows a third embodiment of an inventive micro-mechanical mirror device 1 in a schematic top view. The third embodiment is based on the first embodiment, so that only the differences are explained below.

The connecting spring structures 9a of the connecting spring structures 9 are arranged and configured to be elastically deformable in such a way that, in the resonant vibrational state, they torsion back and forth about a torsion axis extending transversely to the edge 7 of the plate-shaped mirror 2 as seen from the direction of the z-axis. The two connecting spring structures 9a are arranged opposite each other on the x-axis and perform exclusively the function of a torsion spring.

According to a functional further development of the invention, the second connecting spring structure group contains four connecting spring structures 9d of the connecting spring structures 9 which, in the rest state RZ, are arranged adjacent to the y-axis and are arranged mirror-symmetrically with respect to the xz plane and the yz plane.

The four connecting spring structures 9d can have the same elasticity.

The connecting spring structures 9d of the connecting spring structures 9 are arranged and configured to be elastically deformable in such a way that, in the resonant vibrational state, a back and forth offset occurs between the closed frame structure 6 and the plate-shaped mirror 2 at the respective connecting spring structure 9b in a direction of offset extending in parallel to the z-axis, and that, in the resonant vibrational state, they torsion back and forth about a torsion axis extending transversely to the edge 7 of the plate-shaped mirror 2 as seen from the direction of the z-axis. The four connecting spring structures 9d are arranged adjacent to the y-axis and perform both the function of a bending spring and the function of a torsion spring.

In the inventive embodiment according to FIG. 5, a mirror plate 2 which can be deflected rotatably about the x axis (or translationally in the z direction) is connected to the ring-shaped frame structure 6 by means of four connecting spring structures 9d and two connecting spring structures 9a. The connecting spring structures 9d and 9a can have different geometry parameters or rigidities. The connecting spring structures 9d and 9a are arranged symmetrically with respect to both axes. The connecting spring structures 9a extend in the x-axis or rotational axis of the scanner mirror 2. The six connecting spring structures 9 in total are T-shaped by the openings 10 in such a way that three beam spring portions 11a, 11b, 11c are produced per connecting spring structure 9, two beam spring portions 11b, 11c each being arranged in parallel and one beam spring portion 11a perpendicular to the inner annular circumference line. The perpendicular beam spring portion 11a here is connected to the mirror plate 2. The beam spring portions 11 have defined torsion and bending rigidities and can be configured to be straight or curved, e.g. in parallel to the shape of the outer edge 7 of the mirror plate 2. The closed ring-shaped frame structure 6 is connected to the anchor 5 via the spring structures 8a located in the axis of rotation and the plate-shaped mirror 2 is thus firmly mounted.

Figure 6:
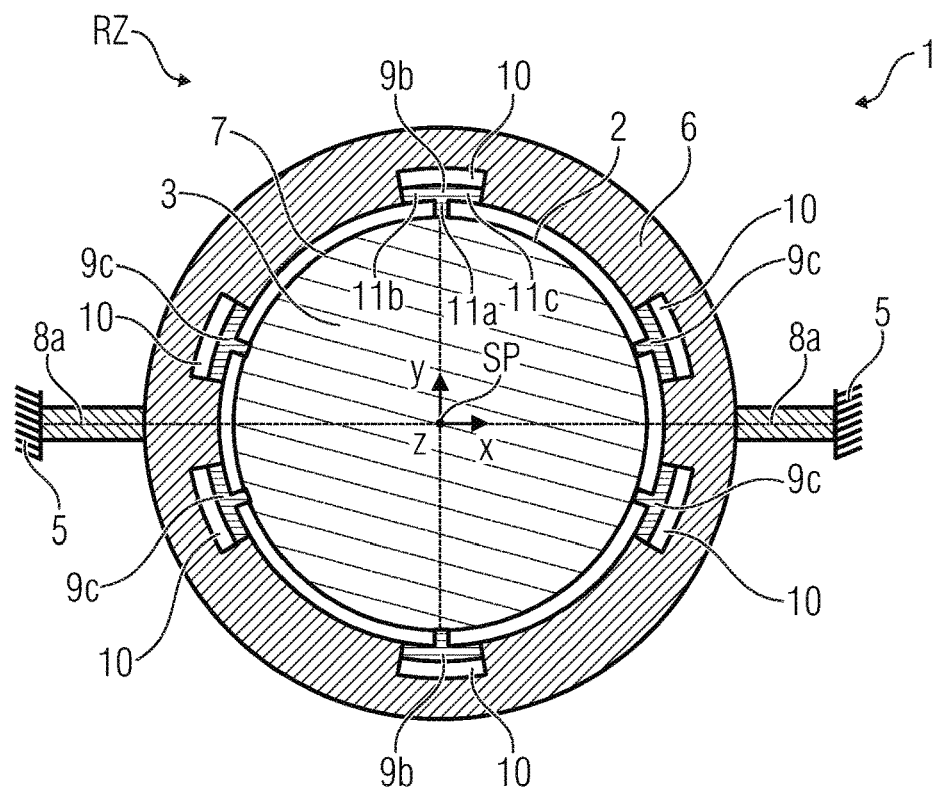
FIG. 6 shows a fourth embodiment of an inventive micromechanical mirror device in the rest state in a schematic top view.

FIG. 6 shows a fourth embodiment of an inventive micromechanical mirror device 1 in a schematic top view. The fourth embodiment is based on the first embodiment, so that only the differences are explained below.

The second connecting spring structure group contains two connecting spring structures 9b of the connecting spring structures 9 which, in the rest state RZ, are arranged along the y-axis and arranged mirror-symmetrically with respect to the yz-plane.

The connecting spring structures 9b of the connecting spring structures 9 are arranged and configured to be elastically deformable in such a way that, in the resonant vibrational state, a back and forth offset occurs between the closed frame structure 6 and the plate-shaped mirror 2 at the respective connecting spring structure 9b in a direction of offset in parallel to the z-axis. The two connecting spring structures 9b are arranged opposite each other on the y-axis and perform exclusively the function of a bending spring.

According to an advantageous further development of the invention, the first connecting spring structure group contains four connecting spring structures 9c of the connecting spring structures 9 which, in the rest state RZ, are arranged adjacent to the x-axis and are arranged mirror-symmetrically with respect to the xz plane and the yz plane.

The four connecting spring structures 9c can have the same elasticity.

The connecting spring structures 9c of the connecting spring structures 9 are arranged and configured to be elastically deformable in such a way that, in the resonant vibrational state, a back and forth offset occurs between the closed frame structure 6 and the plate-shaped mirror 2 at the respective connecting spring structure 9c in a direction of offset extending in parallel to the z-axis, and that, in the resonant vibrational state, they torsion back and forth about a torsion axis extending transversely to the edge 7 of the plate-shaped mirror 2 as seen from the direction of the z-axis. The four connecting spring structures 9c are arranged adjacent to the y-axis and perform both the function of a bending spring and the function of a torsion spring.

In the inventive embodiment according to FIG. 6, a mirror plate 2 which can be deflected rotatably about the x-axis is connected to the ring-shaped frame structure 6 by means of two connecting spring structures 9b and four connecting spring structures 9c. The connecting spring structures 9b and 9c can have different geometry parameters or total rigidities. The connecting spring structures 9b and 9c are arranged symmetrically with respect to both axes. The connecting spring structures 9b extend in the y-axis (perpendicular to the axis of rotation) of the plate-shaped mirror 2. The total of six connecting spring structures 9 are T-shaped here by the defined openings 10 in such a way that three beam spring portions 11a, 11b, 11c are produced per connecting spring structure 9, two beam spring portions 11b, 11c being arranged in parallel and one beam spring portion 11a perpendicular to the inner annular circumferential line 7. The perpendicular beam spring portion 11a here is connected to the mirror plate 2. The beam spring portions 11 have defined torsion and bending rigidities. The closed ring-shaped frame structure 6 is connected to the anchor 5 via the spring structures 8a located in the axis of rotation and the plate-shaped mirror 2 is thus firmly mounted.

Figure 7:
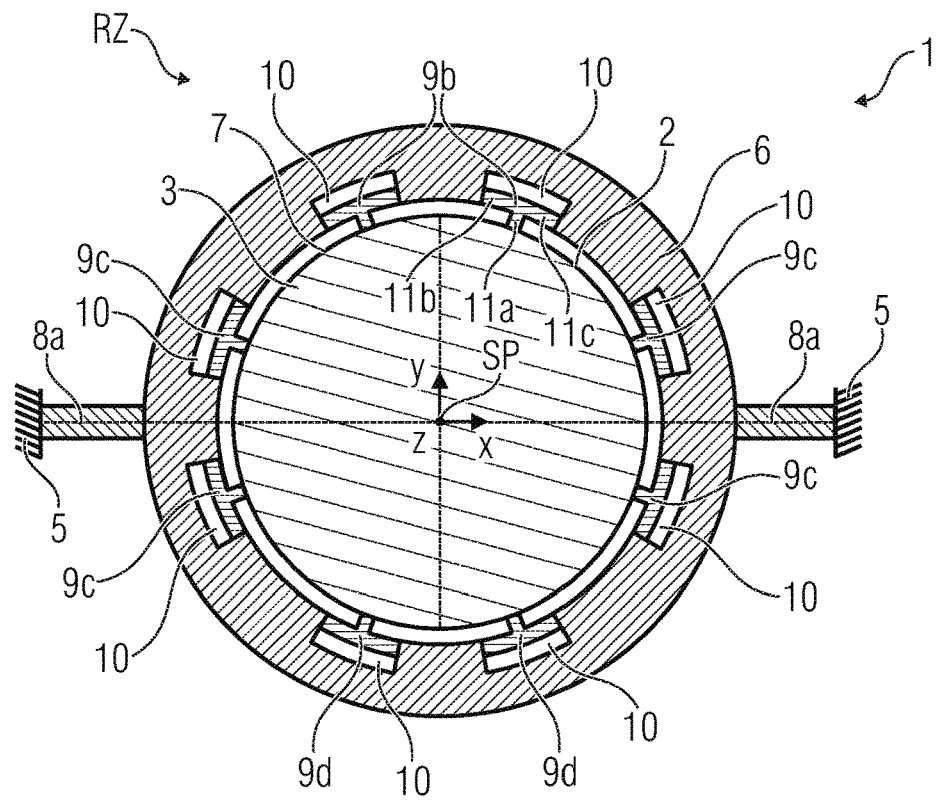
FIG. 7 shows a fifth embodiment of an inventive micromechanical mirror device in a rest state in a schematic top view.

FIG. 7 shows a fifth embodiment of an inventive micromechanical mirror device 1 in a schematic top view. The fifth embodiment is based on the third and fourth embodiments, so that only the differences are explained below. The first connecting spring structure group comprises four connecting spring structures 9c of the connecting spring structures 9, which are configured as described above. Furthermore, the second connecting spring structure group comprises four connecting spring structures 9d of the connecting spring structures 9, which are also configured as described above.

In the inventive embodiment according to FIG. 7, a mirror plate 2 which can be deflected rotatably about the x axis (or translationally in z direction) is connected to the ring-shaped frame structure 6 by means of four connecting spring structures 9c and four connecting spring structures 9d. The connecting spring structures 9c and 9d can have different geometry parameters or total rigidities. The connecting spring structures 9c and 9d are arranged symmetrically with respect to both axes, wherein the connecting spring structures 9d are closer to the y-axis and the connecting spring structures 9c are closer to the x-axis. The total of eight connecting spring structures 9 are T-shaped by the defined openings 10 in such a way that three beam spring portions 11a, 11b, 11c are formed per connecting spring structure 9, wherein two beam spring portions 11b, 11c are arranged in parallel and one beam spring portion 11a perpendicular to the inner annular circumference line 7. The perpendicular beam spring portion 11a here is connected to the mirror plate 2. The beam spring portions 11 have defined torsion and bending rigidities. The closed ring-shaped frame structure 6 is connected to the anchor 5 via the spring structures 8a located in the axis of rotation and the plate-shaped mirror 2 is thus firmly mounted.

Figure 8:
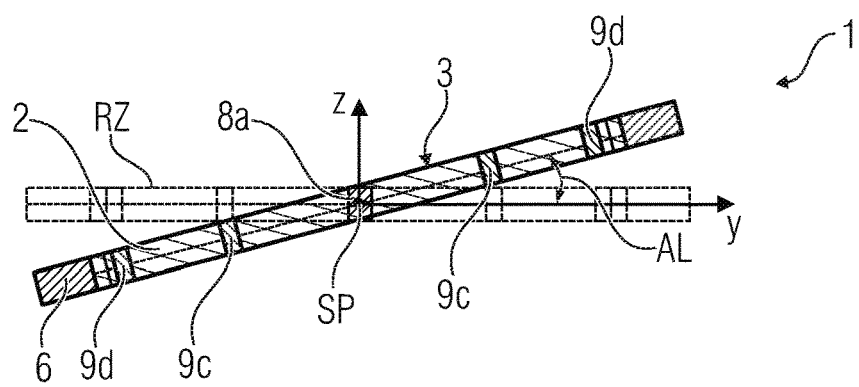
FIG. 8 shows the fifth embodiment of an inventive micromechanical mirror device in the point of reversal in a schematic side view.

FIG. 8 shows the fifth embodiment of an inventive micromechanical mirror device 1 in a schematic side view. The plate-shaped mirror 2 and the closed frame are deflected from the rest state RZ by a rotational deflection AL.

Figure 9:
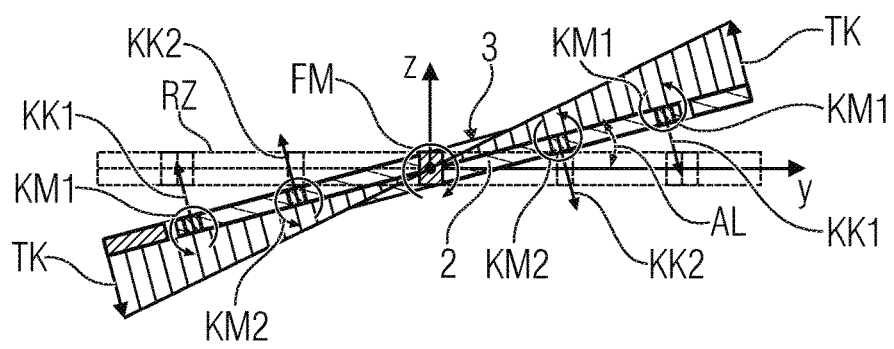
FIG. 9 is a representation of the forces and moments acting on the deflected fifth embodiment in a schematic side view.

FIG. 9 shows a schematic side view of the forces KK, TK and moments FM, KM acting on the fifth embodiment. The diagram shows the spring moment FM, which is exerted on the closed frame structure 6 by a spring structure 8a and is opposed to the deflection. In addition, the coupling forces KK1 and the coupling moments KM1 are shown, which are caused by the spring moments FM and are transmitted from the closed frame structure 6 to the plate-shaped mirror 2 by means of the connecting spring structures 9d and are thus also opposed to the deflection. Also shown are the coupling forces KK2 and the coupling forces KM2, which are caused by the spring moments FM and transmitted from the closed frame structure 6 to the plate-shaped mirror 2 by means of the connecting spring structures 9c and are opposite to the deflection AL. Furthermore, the inertia forces TK caused by the accelerated movement of the mirror plate 2 and distributed over the entire mirror plate 2 are shown, which act in the direction of the deflection AL. The magnitude of these inertial forces TK depends on the distance to the axis of rotation x of the scanner mirror 1 and is generally maximum at the outermost edge and 0 on the axis of rotation.

It becomes clear that the coupling forces KK transmitted to the mirror plate 2 via the connecting spring structures 9 counteract the inertial forces TK acting on the mirror plate 2, thus reducing the dynamic deformation of the plate-shaped mirror 2. The effect of reducing the dynamic deformation becomes greater when the coupling forces KK are set in the range of the inertial forces. This can be achieved by adjusting the rigidities of the connecting spring structures 9 by specifically selecting the geometry parameters on the one hand and by adjusting the position of the connecting spring structures in the xy plane along the edge of the mirror plate 7 on the other hand. The plate-shaped mirror plate 2 is thus specifically decoupled using the closed frame structure 6 and the selection of the connecting spring structures 9. The dynamic deformation of the closed frame structure 6 also occurring can be neglected in comparison to the superimposed deformation by the spring structure 8a. The deformation of the closed frame structure 6 caused by the spring structures 8a in turn leads to undesired coupling moments KM1 and KM2, which, however, have a considerably lower effect on the deformation of the plate-shaped mirror plate 2 due to the elasticity with respect to the torsion of the connecting spring structures 9c and 9d.

Figure 10:
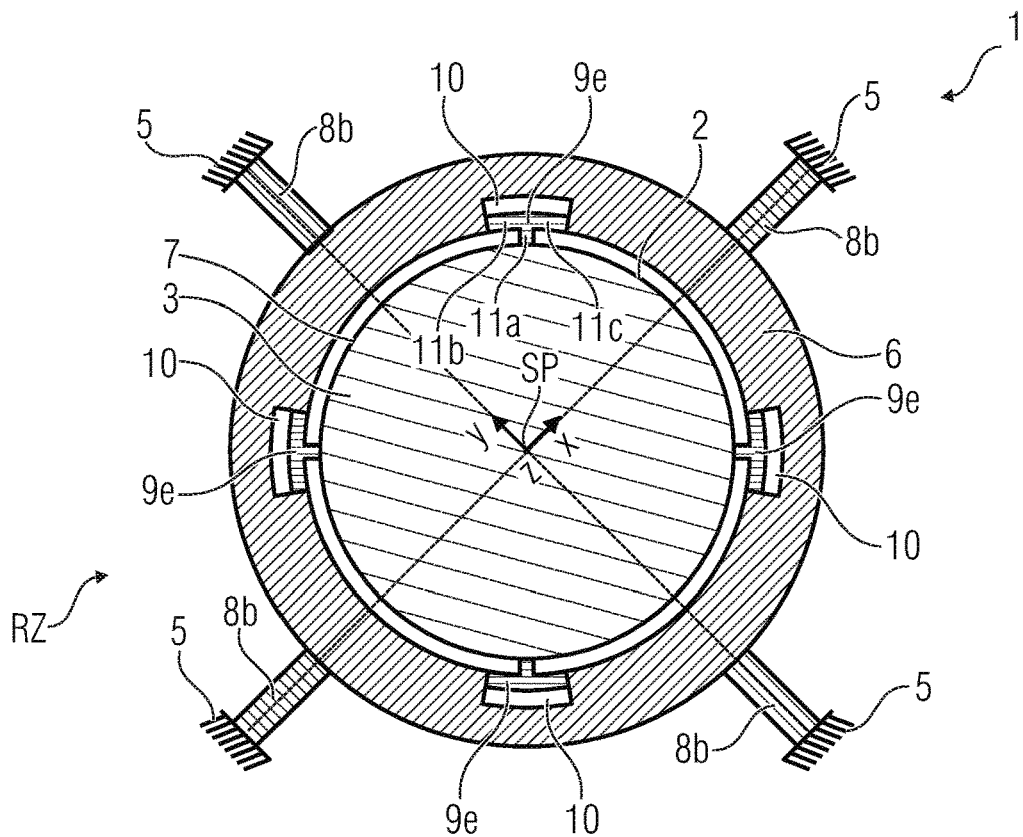
FIG. 10 shows a sixth embodiment of an inventive micromechanical mirror device in the rest state in a schematic top view.

FIG. 10 shows a sixth embodiment of an inventive micromechanical mirror device 1 in a schematic top view. The fifth embodiment is based on the previous embodiments, so that in the following only the differences are explained.

According to an advantageous further development of the invention, the spring arrangement comprises at least two spring structures 8b, which are configured and arranged in such a way that the closed frame structure 6 and the plate-shaped mirror 2 can be deflected translationally in the direction of the z-axis.

According to an advantageous further development of the invention, the connecting arrangement comprises at least four connecting spring structures 9e, which exhibit the same elastic deformability.

According to an appropriate further development of the invention, a number of spring structures 8 corresponds to a number of connecting spring structures 9, wherein the spring structures 8 and the connecting spring structures 9 are arranged alternately along the edge 7.

In the inventive embodiment according to FIG. 10, an elliptical mirror plate 2 that can be deflected translationally in the z-direction is connected to the ring-shaped frame structure 6 by means of four connecting spring structures 9e. The connecting spring structures 9e have the same geometry parameters or total rigidities. The connecting spring structures 9e are arranged at equal distances from one another and rotated by 45° with respect to the main axis. The four connecting spring structures 9 in total are T-shaped here by the defined openings 10 in such a way that three beam spring portions 11a, 11b, 11c are formed per connecting spring structure 9, wherein two 11b, 11c are arranged in parallel and one beam spring portion 11a perpendicular to the inner annular circumferential line 7. The perpendicular beam spring portion 11a here is connected to the mirror plate 2. The beam spring portions 11 have defined torsion and bending rigidities. The closed ring-shaped frame structure 6 is connected to the anchor 5 by means of four spring structures 8b arranged at equal distances from one another and from the connecting spring structures 9e and the plate-shaped mirror 2 is thus firmly mounted. The four spring structures 8b are arranged in the main axes.

Figure 11:
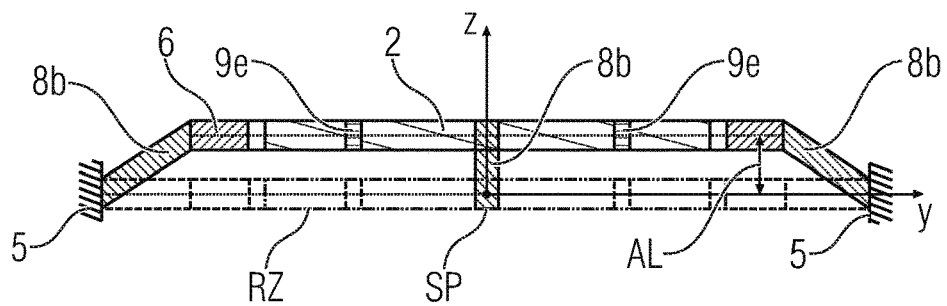
FIG. 11 shows the sixth embodiment of an inventive micromechanical mirror device in the point of reversal in a schematic side view.

FIG. 11 shows the sixth embodiment of an inventive micromechanical mirror device 1 in a schematic side view. The plate-shaped mirror 2 and the closed frame are deflected from the rest state RZ by a translational deflection AL.

Figure 12:
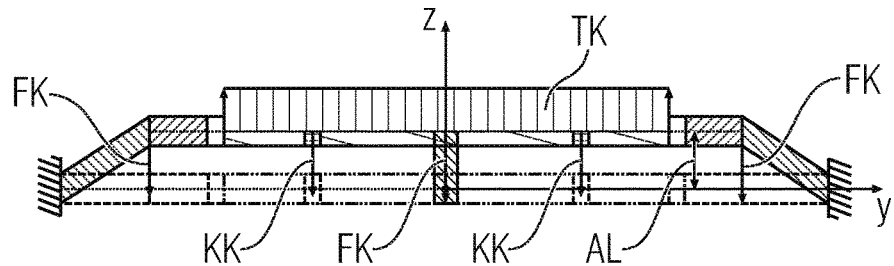
FIG. 12 is a representation of the forces acting on the sixth deflected embodiment in a schematic side view.

FIG. 12 shows a schematic side view of the forces acting on the sixth embodiment. The spring forces FK, which are exerted on the closed frame structure 6 by the spring structures 8b and are opposed to the deflection AL, are shown. In addition, the coupling forces KK are shown, which are caused by the spring forces and are transmitted to the plate-shaped mirror 2 via the closed frame structure 6 through the connecting spring structures 9e and are also opposite to the deflection AL. In addition, the inertia forces TK which are caused by the accelerated movement of the mirror plate 2 and distributed equally over the entire plate-shaped mirror plate 2 are shown, which act in the direction of the deflection AL. It becomes clear that the coupling forces KK transmitted to the mirror plate 2 via the connecting spring structures 9 counteract the inertial forces TK acting on the mirror plate 2, whereby the dynamic deformation of the plate-shaped mirror 2 is reduced when the coupling forces KK are set in the range of the inertial forces. This can be achieved by specifically decoupling the mirror plate 2 from the spring structures 8b by means of adapting the rigidities of the connecting spring structures 9 between the frame structure 6 and the plate-shaped mirror plate 2 by selecting the geometry parameters on the one hand and adapting the position of the connecting spring structures in the xy plane along the edge of the mirror plate 7 on the other hand.

The coupling moments KM include components which are caused by a dynamic deformation of the closed frame structure 6. These components are at least partially compensated by the elasticity of the connecting spring structures 9e. Due to the elasticity of the connecting spring structures 9e, the coupling moments KM are therefore considerably smaller than would be the case with a rigid coupling of the plate-shaped mirror 2 with the closed frame structure 6, so that the dynamic deformation of the plate-shaped mirror 2 is reduced.

Figure 13:
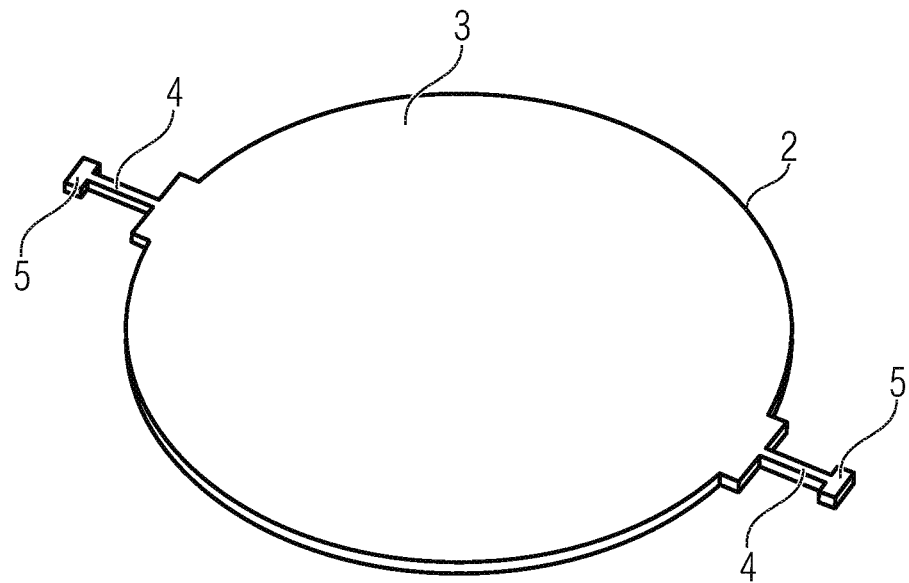
FIG. 13 is a perspective view of the known micromechanical mirror device.

FIG. 13 shows a perspective view of the known micromechanical mirror device 1 in the rest position of FIG. 1 with an aperture of 3.5 mm and a resonant frequency of 4000 Hz.

Figure 14:
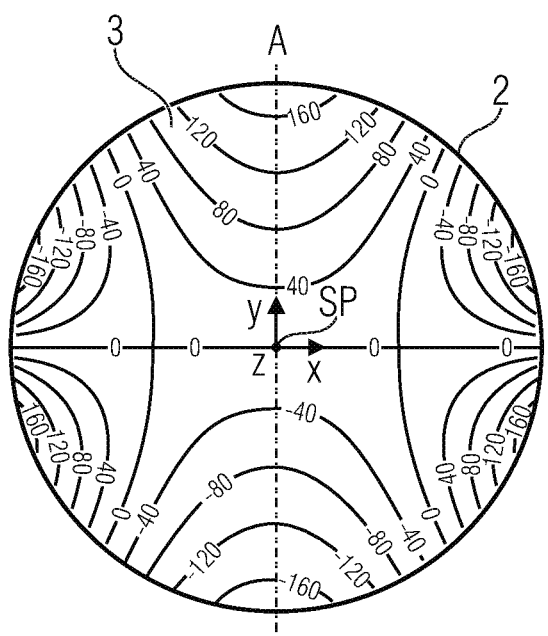
FIG. 14 is a representation of the dynamic deformation of the known micromechanical mirror device in the point of reversal by means of contour lines.

FIG. 14 exemplarily shows a representation of the dynamic deformation of a plate-shaped mirror plate 2 of a known micromechanical mirror device 1 of FIG. 13 with a deflection AL around the x-axis of 1° by means of contour lines. The square mean of the dynamic deformation is 82 nm. Furthermore, the maximum amplitude of the dynamic deformation from peak to peak is 366 nm. The dynamic deformation of the plate-shaped mirror plate 2 in the area of the spring structures 4 of FIG. 13, which is opposite to the deflection AL, in the region of the intersection points of mirror plate edge 7 and x-axis can be clearly seen on the one hand. Here, the values of the dynamic deformation in the first quadrant are in the negative range. On the other hand, values of the mainly inertia-related dynamic deformations in the area of the intersection points of mirror plate edge 7 and y-axis (in the first quadrant) are in the positive range, i.e. in the direction of the deflection.

Figure 15:
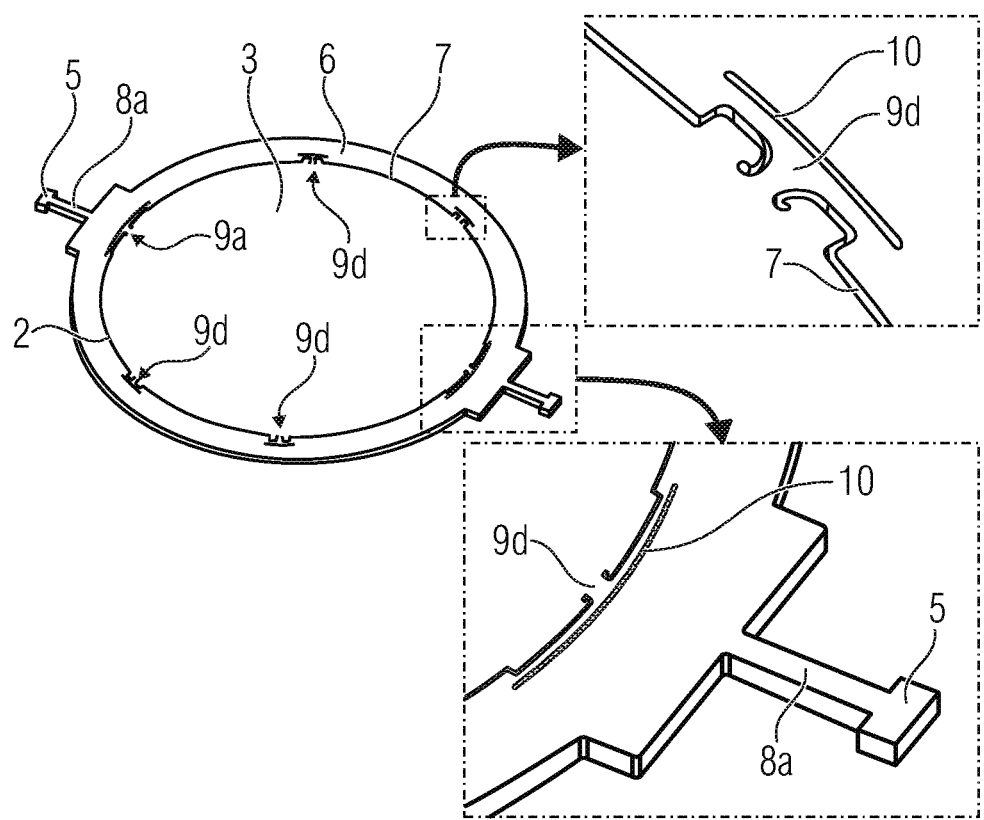
FIG. 15 is a perspective view of the third embodiment of an inventive micromechanical mirror device in the rest state.

FIG. 15 shows a perspective view of the third embodiment of an inventive micromechanical mirror device 1 of FIG. 5. The plate-shaped mirror 2 corresponds to the plate-shaped mirror 2 of FIG. 13 with respect to its thickness, its material and its diameter, with the same resonant frequency of the scanner mirror.

Figure 16:
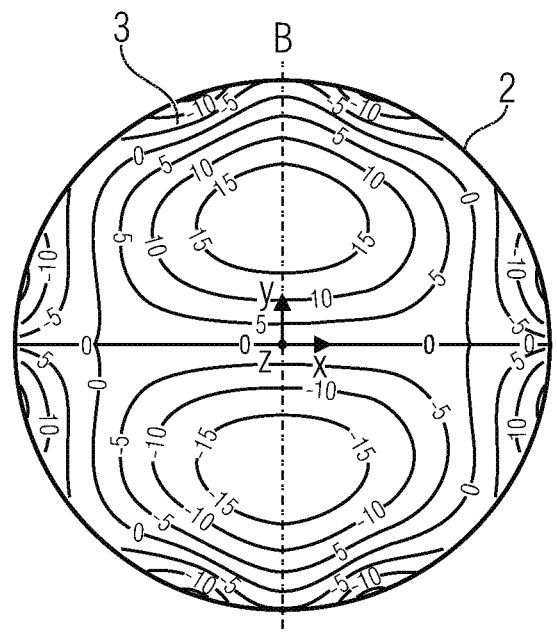
FIG. 16 is a representation of the dynamic deformation of the third embodiment of an inventive micromechanical mirror device in the point of reversal by means of contour lines.

FIG. 16 shows the optimized course of the dynamic deformation of the third embodiment of an inventive micromechanical mirror device 1 of FIG. 15 by means of contour lines. The deflection AL is also 1°. However, the square mean of the dynamic deformation is now only 9 nm and the maximum amplitude of the dynamic deformation from peak to peak only 38.6 nm. The dynamic deformation, coupled in by the spring structure, along the edge of the mirror plate 7 is clearly visible, which is opposite to the deflection Al, i.e. has negative values in the first quadrant. In contrast, the region between the x-axis and the point of intersection of the mirror plate edge and the y-axis shows a dynamic deformation in the direction of the deflection AL, i.e. positive values in the first quadrant.

Figure 17:
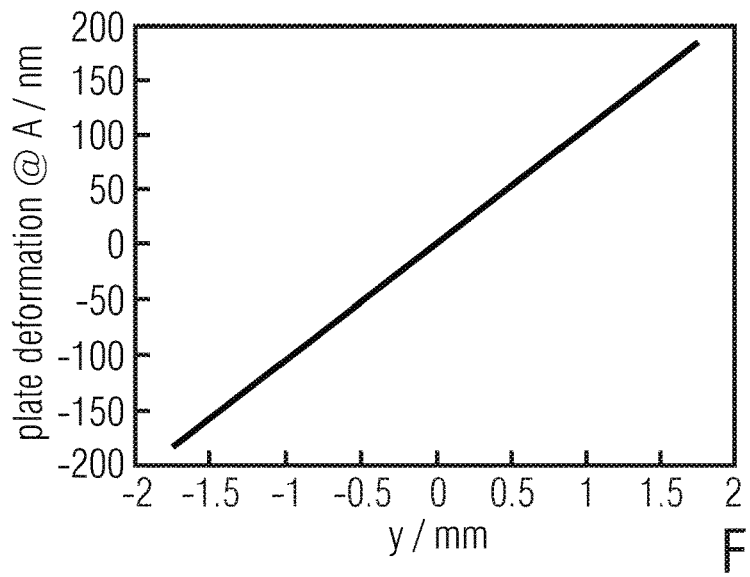
FIG. 17 is a diagram showing the dynamic deformation of the known micromechanical mirror device along a section A.

FIG. 17 is a diagram showing the dynamic deformation of the known micromechanical mirror device 1 of FIG. 13 along a section A along the y-axis. The maximum dynamic deformations occur at the edge 7 of the plate-shaped mirror 2 on both sides of the center of gravity SP and amount to −183 nm on one side and +183 nm on the other side.

Figure 18:
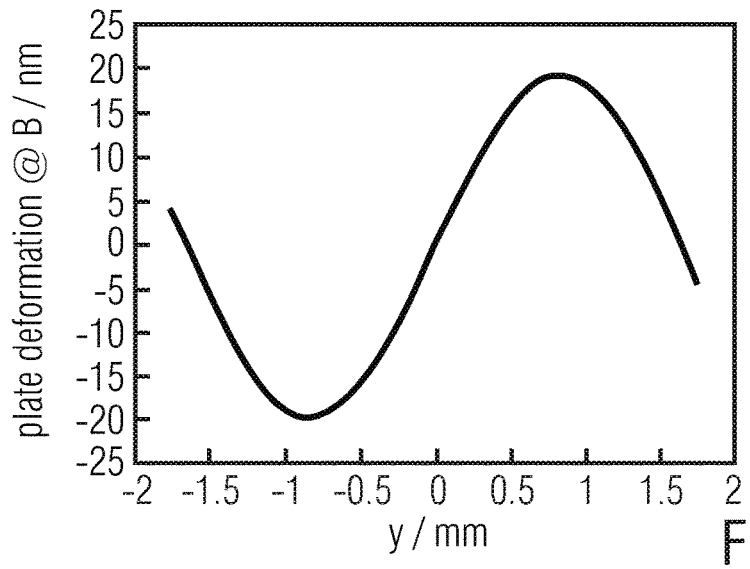
FIG. 18 is a diagram showing the dynamic deformation of the third embodiment of an inventive micromechanical mirror device along a section B.

To illustrate the compensation of the two deformation components of the dynamic deformation, FIG. 18 is a diagram to illustrate the dynamic deformation of the third embodiment of the inventive micromechanical mirror device 1 of FIG. 15 along a section B along the y-axis. The maximum dynamic deformations occur between the center of gravity SP and the edge 7 of the plate-shaped mirror 2 on both sides of the center of gravity SP and amount to −19.3 nm on one side and +19.3 nm on the other side.

Figure 19:
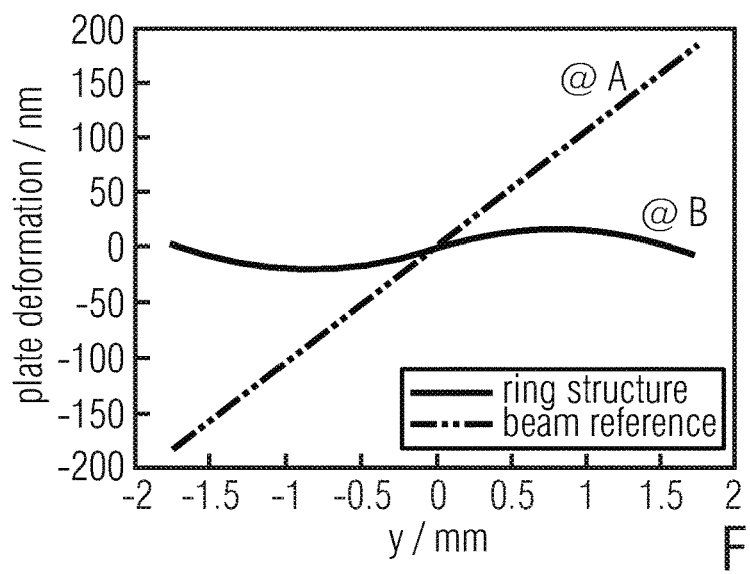
FIG. 19 is a common diagram for representing the dynamic deformation of the known micromechanical mirror device along a section A and for representing the dynamic deformation of the third embodiment of an inventive micromechanical mirror device along a section B.

FIG. 19 is a common diagram for the representation of the dynamic deformation of the known micromechanical mirror device 1 along a section A and for the representation of the dynamic deformation of the third embodiment of an inventive micromechanical mirror device 1 along a section B. FIG. 19 shows the curves of FIGS. 17 and 18 on the same scale. A significant reduction of the dynamic deformation by almost one order of magnitude is clearly visible.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

REFERENCES

[1] DE 10 2004 037 833 A1
[2] DE 10 2005 033 800 A1
[3] U.S. Pat. No. 7,301,692 B2
[4] U.S. Pat. No. 7,256,919 B1
[5] U.S. Pat. No. 8,345,336 B2
[6] US 2002/0041455 A1
[7] US 2013/0250390 A1

The invention claimed is:

1. A micromechanical mirror device comprising:
a plate-shaped mirror comprising a reflecting surface for reflecting light, the reflecting surface being configured to be planar in a rest state and aligned in parallel to an xy plane of a rectangular coordinate system comprising an x-axis, a y-axis and a z-axis, wherein, in the rest state, a center of gravity of the plate-shaped mirror is located in an origin of the coordinate system;
a closed frame structure which supports the plate-shaped mirror and which, in the rest state, completely frames an edge of the plate-shaped mirror as seen from the direction of the z axis;
a spring arrangement comprising at least two spring structures which, in the rest state, are arranged mirror-symmetrically with respect to an xz plane of the coordinate system and an yz plane of the coordinate system and which connect the closed frame structure to a supporting structure which is stationary in the coordinate system, the spring arrangement being configured such that the closed frame structure and the plate-shaped mirror can be brought into a resonant vibrational state relative to the supporting structure by means of electrostatic, electromagnetic or piezoelectric forces; and
a connecting arrangement comprising at least four connecting spring structures which, in the rest state, are arranged mirror-symmetrically with respect to the xz plane and the yz plane and which each connect the plate-shaped mirror to the closed frame structure; the connecting spring structures being configured to be elastically deformable and arranged in such a way that they deform back and forth in the resonant vibrational state, so that the plate-shaped mirror is partially mechanically decoupled from the closed frame structure.

2. The micromechanical mirror device according to claim 1, wherein at least two connecting spring structures of the connecting spring structures are arranged and configured to be elastically deformable in such a way that, in the resonant vibrational state, they torsion back and forth about a torsion axis extending transversely to the edge of the plate-shaped mirror as seen from the direction of the z axis.

3. The micromechanical mirror device according to claim 1, wherein at least two connecting spring structures of the connecting spring structures are arranged and configured to be elastically deformable in such a way that, in the resonant vibrational state, a back and forth offset occurs between the closed frame structure and the plate-shaped mirror at the respective connecting spring structure in a direction of offset extending in parallel to the z-axis.

4. The micromechanical mirror device according to claim 1, wherein at least two of the connecting spring structures are separated from the closed frame structure by a first opening on their side facing away from the origin.

5. The micromechanical mirror device according to claim 1, wherein at least two of the connecting spring structures are separated from the plate-shaped mirror by a second opening on their side facing the origin.

6. The micromechanical mirror device according to claim 1, wherein, as seen from the direction of the z axis, at least two of the connecting spring structures are T-shaped in such a way that they each comprise three beam spring portions each comprising a first end region and a second end region, wherein the three beam spring portions are connected to one another at the first end regions, wherein a first beam spring portion of the beam spring portions extends transversely to the edge of the plate-shaped mirror.

7. The micromechanical mirror device according to claim 6, wherein the first beam spring portion is connected to the plate-shaped mirror at the second end region, and wherein a second beam spring portion and a third beam spring portion of the beam spring portions each extend along the edge of the plate-shaped mirror and are each connected to the closed frame structure at the second end region.

8. The micromechanical mirror device according to claim 7, wherein the second beam spring portions and the third beam spring portions of the T-shaped connecting spring structures, which each extend along the edge of the plate-shaped mirror, are separated from the closed frame structure by a first opening on their side facing away from the origin.

9. The micromechanical mirror device according to claim 6, wherein the first beam spring portion is connected to the closed frame structure at the second end region, and wherein a second beam spring portion and a third beam spring portion of the beam spring portions each extend along the edge of the plate-shaped mirror and are each connected to the plate-shaped mirror at the second end region.

10. The micromechanical mirror device according to claim 9, wherein the second beam spring portions and third beam spring portions of the T-shaped connecting spring structures, which each extend along the edge of the plate-shaped mirror, are each separated from the plate-shaped mirror by a second opening on their side facing the origin.

11. The micromechanical mirror device according to claim 1, wherein, as seen from the direction of the z-axis, at least two of the connecting spring structures are H-shaped such that they each comprise five beam spring portions each comprising a first end region and a second end region, wherein a first beam spring portion of the beam spring portions extends transversely to the edge of the plate-shaped mirror, wherein the first end region of the first beam spring portion is connected to the first end regions of a second beam spring portion and a third beam spring portion of the beam spring portions, which each extend along the edge of the plate-shaped mirror and are each connected to the closed frame structure at the second end region, and wherein the second end region of the first beam spring portion is connected to the first end regions of a fourth beam spring portion and a fifth beam spring portion of the beam spring portions, which extend along the edge of the plate-shaped mirror and are each connected to the plate-shaped mirror at the second end region.

12. The micromechanical mirror device according to claim 11, wherein the second beam spring portion and the third beam spring portion of the H-shaped connecting spring structures, which each extend along the edge of the plate-shaped mirror and are each connected to the closed frame structure at the second end region, are each separated from the closed frame structure by a first opening on their side facing away from the origin.

13. The micromechanical mirror device according to claim 11, wherein the fourth beam spring portion and the fifth beam spring portion of the H-shaped connecting spring structures, which each extend along the edge of the plate-shaped mirror and are each connected to the plate-shaped mirror at the second end region, are each separated from the plate-shaped mirror by a second opening on their side facing the origin.

14. The micromechanical mirror device according to claim 1, wherein the spring arrangement comprises exactly two spring structures which are configured and arranged in such a way that the closed frame structure and the plate-shaped mirror can be deflected rotatably about the x axis.

15. The micromechanical mirror device according to claim 14, wherein the connecting arrangement comprises a first connecting spring structure group comprising a part of the connecting spring structures and a second connecting spring structure group comprising another part of the connecting spring structures, wherein the connecting spring structures of the first connecting spring structure group comprising a first elastic deformability, wherein the connecting spring structures of the second connecting spring structure group comprise a second elastic deformability, and wherein the first elastic deformability and the second elastic deformability differ.

16. The micromechanical mirror device according to claim 15, wherein the first connecting spring structure group comprises two connecting spring structures of the connecting spring structures which, in the rest state, are arranged along the x-axis and are arranged mirror-symmetrically with respect to the yz plane.

17. The micromechanical mirror device according to claim 15, wherein the first connecting spring structure group comprises four connecting spring structures of the connecting spring structures which, in the rest state, are arranged adjacent to the x-axis and are arranged mirror-symmetrically with respect to the xz plane and the yz plane.

18. The micromechanical mirror device according to claim 15, wherein the second connecting spring structure group comprises two connecting spring structures of the connecting spring structures which, in the rest state, are arranged along the y-axis and are arranged mirror-symmetrically with respect to the yz plane.

19. The micromechanical mirror device according to claim 15, wherein the second connecting spring structure group comprises four connecting spring structures of the connecting spring structures which, in the rest state, are arranged adjacent to the y-axis and are arranged mirror-symmetrically with respect to the xz plane and the yz plane.

20. The micromechanical mirror device according to claim 1, wherein the spring arrangement comprises at least two spring structures which are configured and arranged such that the closed frame structure and the plate-shaped mirror can be deflected translationally in the direction of the z-axis.

21. The micromechanical mirror device according to claim 20 wherein the connecting arrangement comprises at least four connecting spring structures which comprise the same elastic deformability.

22. The micromechanical mirror device according to claim 20, wherein a number of the spring structures corresponds to a number of connecting spring structures, wherein the spring structures and the connecting spring structures are arranged alternately along the edge.

23. The micromechanical mirror device according to claim 1, wherein, as seen from the direction of the z axis, a distance between the closed frame structure and the plate-shaped mirror is constant along the edge of the plate-shaped mirror, at least outside regions of the connecting spring structures.

* * * * *